(12) United States Patent
Nakamura et al.

(10) Patent No.: US 11,714,120 B2
(45) Date of Patent: *Aug. 1, 2023

(54) SEMICONDUCTOR INSPECTION DEVICE

(71) Applicant: HAMAMATSU PHOTONICS K.K., Hamamatsu (JP)

(72) Inventors: Tomonori Nakamura, Hamamatsu (JP); Yoshitaka Iwaki, Fujisawa (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 34 days.

This patent is subject to a terminal disclaimer.

(21) Appl. No.: 17/515,145

(22) Filed: Oct. 29, 2021

(65) Prior Publication Data
US 2022/0050137 A1 Feb. 17, 2022

Related U.S. Application Data

(63) Continuation of application No. 16/617,840, filed as application No. PCT/JP2018/008830 on Mar. 7, 2018, now Pat. No. 11,209,476.

(30) Foreign Application Priority Data

Jun. 2, 2017 (JP) .................................. 2017-109918

(51) Int. Cl.
*G06T 7/00* (2017.01)
*G01R 31/265* (2006.01)
(Continued)

(52) U.S. Cl.
CPC .......... *G01R 31/2656* (2013.01); *G02B 6/32* (2013.01); *G02B 26/105* (2013.01); *G06T 7/0004* (2013.01); *G06T 2207/30148* (2013.01)

(58) Field of Classification Search
CPC .... G01R 31/2656; G02B 6/32; G02B 26/105; G06T 7/0004; G06T 2207/30148
(Continued)

(56) References Cited

U.S. PATENT DOCUMENTS 5,528,360 A * 6/1996 Kohno ............... G01N 21/8901
356/237.5
6,633,376 B1 10/2003 Nishida et al.
(Continued)

FOREIGN PATENT DOCUMENTS

CN 204054955 U 12/2014
CN 106405826 A 2/2017
(Continued)

OTHER PUBLICATIONS

International Preliminary Report on Patentability dated Dec. 12, 2019 for PCT/JP2018/008830.

*Primary Examiner* — Isiaka O Akanbi
(74) *Attorney, Agent, or Firm* — Faegre Drinker Biddle & Reath LLP

(57) ABSTRACT

An inspection system includes a light source, a mirror, Galvano mirrors, a casing that holds the mirror and the Galvano mirrors inside and includes an attachment portion for attaching an optical element, and a control unit that controls a deflection angle of the Galvano mirrors, wherein the control unit controls the deflection angle so that an optical path optically connected to a semiconductor device is switched between a first optical path passing through the Galvano mirrors and the mirror, and a second optical path passing through the Galvano mirrors and the attachment portion, and controls the deflection angle so that the deflection angle when switching to the first optical path has been performed and the deflection angle when switching to the second optical path has been performed do not overlap.

12 Claims, 13 Drawing Sheets

(51) Int. Cl.
*G02B 6/32* (2006.01)
*G02B 26/10* (2006.01)

(58) Field of Classification Search
USPC .......... 356/246, 318, 417, 436, 237.2–237.6;
382/151–152, 145
See application file for complete search history.

(56) References Cited

U.S. PATENT DOCUMENTS

| | | | |
|---|---|---|---|
| 2009/0295414 A1 | 12/2009 | Falk | |
| 2015/0168713 A1* | 6/2015 | Nowatzyk | A61B 3/1025 |
| | | | 359/201.2 |
| 2016/0313545 A1* | 10/2016 | Kondo | G02B 26/101 |
| 2017/0205622 A1* | 7/2017 | Kudo | G02B 26/105 |
| 2017/0257611 A1* | 9/2017 | Tanaka | G02B 26/105 |
| 2019/0154829 A1* | 5/2019 | McWhirter | G01S 7/4813 |
| 2019/0310351 A1* | 10/2019 | Hughes | G02B 26/101 |

FOREIGN PATENT DOCUMENTS

| | | |
|---|---|---|
| JP | H5-129399 A | 5/1993 |
| JP | H10-118778 A | 5/1998 |
| JP | 2008-188638 A | 8/2008 |
| WO | WO 00/09993 A1 | 2/2000 |
| WO | WO 2009/011441 A1 | 1/2009 |
| WO | WO 2013/172887 A1 | 11/2013 |

\* cited by examiner

SEMICONDUCTOR INSPECTION DEVICE

TECHNICAL FIELD

The present disclosure relates to a semiconductor inspection device that inspects semiconductor devices.

BACKGROUND ART

In the related art, a device that inspects a semiconductor device while applying a test signal has been used. For example, in Patent Literature 1 below, a device including a Galvano mirror, two optical fibers, and a multi-fiber turret that can be optically coupled to the Galvano mirror and the optical fibers is disclosed, in which one of the optical fibers is optically connected to a laser scanning module (hereinafter referred to as an "LSM") and the other optical fiber is optically connected to a single photon detector. In such a device, it is possible to execute inspection of the semiconductor device using the LSM and emitted light measurement using the single photon detector in a switching manner.

CITATION LIST

Patent Literature

[Patent Literature 1] US Patent publication No. 2009/0295414

SUMMARY OF INVENTION

Technical Problem

In the device that inspects a semiconductor device in the related art described above, it is desired to set an optimal optical system in each optical element. That is, when the optical system is shared among the optical elements, spatial accuracy of an optical path in each optical element tends to decrease.

An object of an embodiment is to provide a semiconductor inspection device.

Solution to Problem

An embodiment of the present invention is a semiconductor inspection device. The semiconductor inspection device is a semiconductor inspection device that inspects a semiconductor device, and includes: a first light source configured to emit light for irradiating the semiconductor device with; a light guide element optically connected to the first light source; a pair of Galvano mirrors provided at positions at which the Galvano mirrors are optically connectable to the first light source via the light guide element; a casing holding the light guide element and the pair of Galvano mirrors therein and including a first attachment portion for attaching an optical element, the first attachment element being provided at a position at which the optical element is optically connectable to the pair of Galvano mirrors; and a control unit configured to control a deflection angle of the pair of Galvano mirrors, wherein the control unit controls the deflection angle so that an optical path optically connected to the semiconductor device is switched between a first optical path passing through the pair of Galvano mirrors and the light guide element and a second optical path passing through the pair of Galvano mirrors and the first attachment portion, and controls the deflection angle so that the deflection angle when switching to the first optical path has been performed and the deflection angle when switching to the second optical path has been performed do not overlap.

Advantageous Effects of Invention

With the semiconductor inspection device according to the embodiments, it is possible to inspect a semiconductor device with high accuracy by improving spatial accuracy of optical paths in a plurality of optical elements.

DESCRIPTION OF EMBODIMENTS

Hereinafter, preferred embodiments of a semiconductor inspection device will be described in detail with reference to the drawings. It should be noted that, in the description of the drawings, the same or corresponding parts will be denoted by the same reference signs and redundant description will be omitted.

First Embodiment

Figure 1:
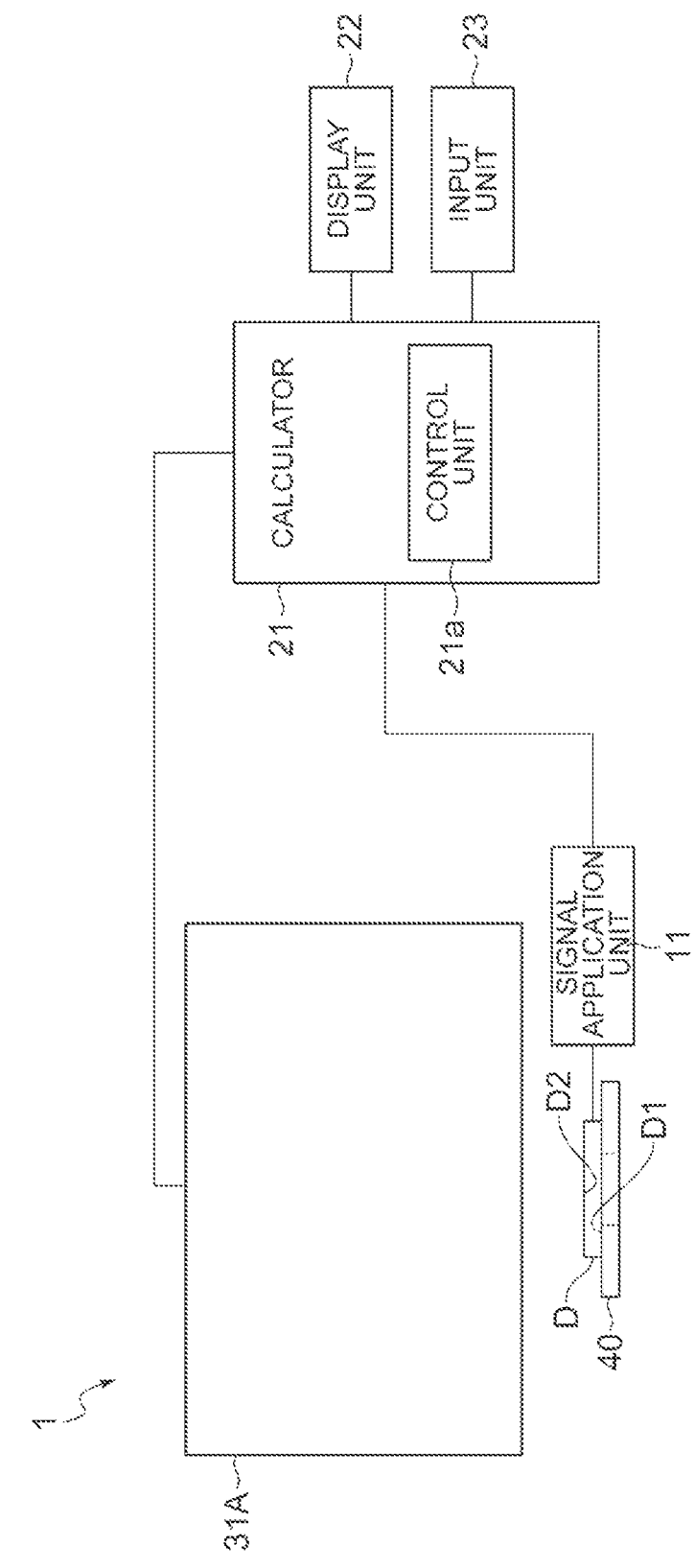
FIG. 1 is a configuration diagram of an inspection system according to a first embodiment.

As illustrated in FIG. 1, an inspection system 1 according to a first embodiment is a semiconductor inspection device for inspecting a semiconductor device D that is a device under test (DUT), such as specifying a fault location in the semiconductor device D. Further, the inspection system 1 may perform, for example, a process of performing marking indicating a fault location around the fault location, in addition to the process of specifying the fault location. Through the marking, it is possible to easily ascertain the fault location specified by the inspection system 1 in a post-process of fault analysis.

Examples of the semiconductor device D include an individual semiconductor element (discrete), an optoelectronic element, a sensor/actuator, a logic large scale integration (LSI), a memory element, a linear integrated circuit (IC), or a hybrid device thereof. The discrete semiconductor element includes a diode, a power transistor, and the like. The logic LSI is configured of a transistor having a metal-oxide-semiconductor (MOS) structure, a transistor having a bipolar structure, and the like. Further, the semiconductor device D may be a package or a composite substrate, including a semiconductor device, or the like. The semiconductor device D is configured by forming a metal layer on a substrate. For example, a silicon substrate is used as the substrate of the semiconductor device D. The semiconductor device D is placed on a sample stage 40.

This inspection system 1 includes a signal application unit 11, a calculator 21, a display unit 22, an input unit 23, and an optical device 31A.

The signal application unit 11 is electrically connected to the semiconductor device D via a cable and applies a stimulation signal to the semiconductor device D. The signal application unit 11 is, for example, a tester unit, is operated by a power supply (not illustrated), and repeatedly applies a stimulation signal such as a predetermined test pattern to the semiconductor device D. The signal application unit 11 may apply a modulation current signal or may apply a continuous wave (CW) current signal. The signal application unit 11 is electrically connected to the calculator 21 via a cable, and applies a stimulation signal such as a test pattern designated by the calculator 21 to the semiconductor device D. It should be noted that the signal application unit 11 may not necessarily be electrically connected to the calculator 21. When the signal application unit 11 is not electrically connected to the calculator 21, the signal application unit 11 determines the stimulation signal such as the test pattern alone and applies the stimulation signal such as the test pattern to the semiconductor device D. The signal application unit 11 may be a pulse generator that generates a predetermined signal and applies the predetermined signal to the semiconductor device D.

The calculator 21 is electrically connected to the optical device 31A via a cable. The calculator 21 is, for example, a computer including a processor (a central processing unit (CPU)) and a storage medium such as a random access memory (RAM), a read only memory (ROM), a hard disk drive (HDD), and the like. The calculator 21 executes a process of a processor for data stored in a storage medium. Further, the calculator 21 may be configured of a microcomputer, a field-programmable gate array (FPGA), a cloud server, and the like. The calculator 21 creates a pattern image or an analysis image (for example, an emitted light image) on the basis of a detection signal input from the optical device 31A. Here, it is difficult to specify a detailed position in a pattern of the semiconductor device D only with the analysis image. Therefore, the calculator 21 generates, as the analysis image, a superimposed image in which a pattern image based on reflected light from the semiconductor device D and the analysis image of the semiconductor device D are superimposed.

Further, the calculator 21 outputs the created analysis image to the display unit 22. The display unit 22 is a display device such as a display for showing the analysis image or the like to a user. The display unit 22 displays the input analysis image. In this case, the user confirms a position of the fault location from the analysis image displayed on the display unit 22, and inputs information indicating the fault location to the input unit 23. The input unit 23 is an input device such as a keyboard and a mouse that receive an input from the user. The input unit 23 outputs, to the calculator 21, the information indicating the fault location received from the user. It should be noted that the calculator 21, the display unit 22, and the input unit 23 may be smart device terminals.

Figure 2:
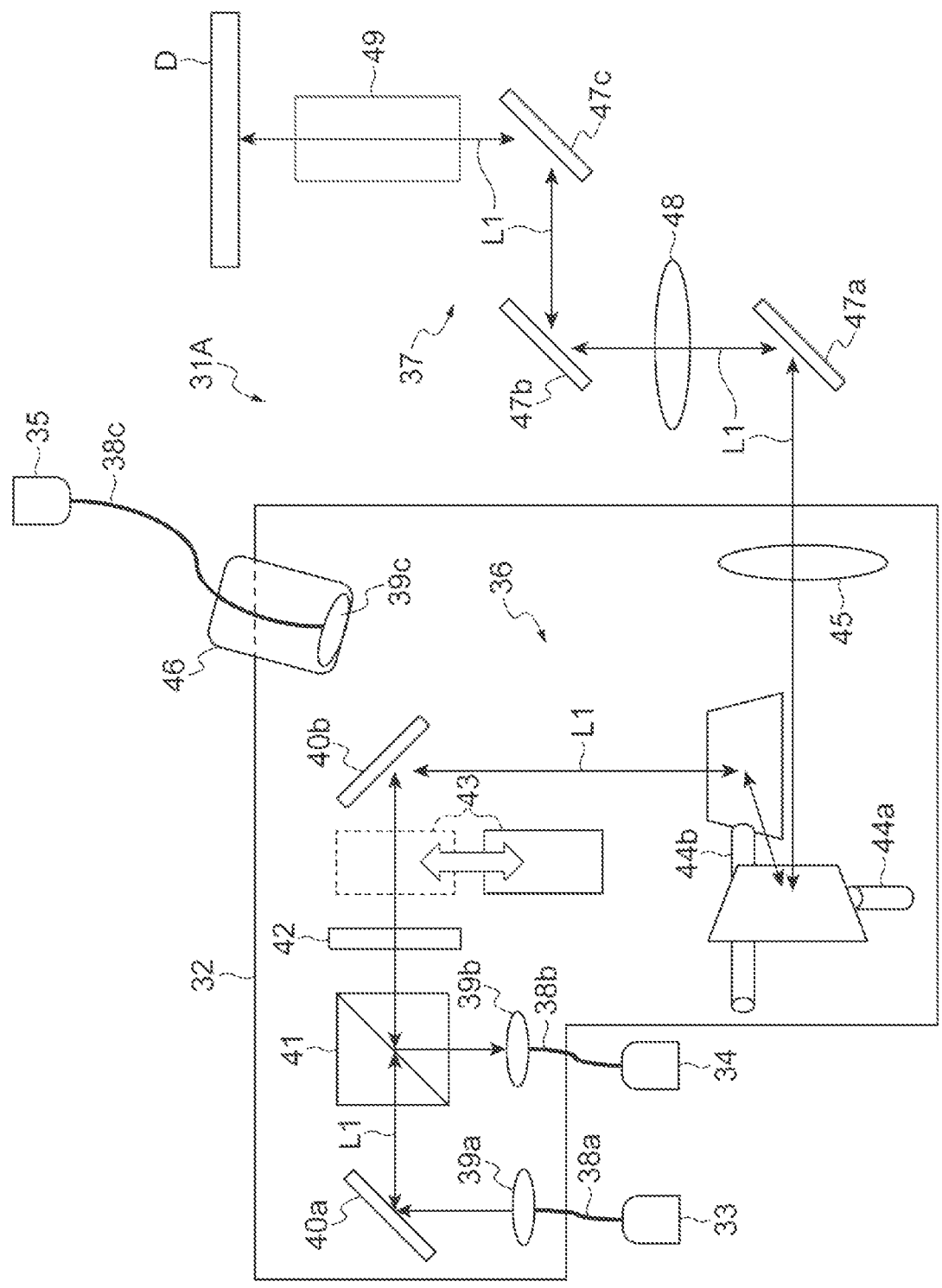
FIG. 2 is a diagram illustrating a configuration in a state in which switching to a first inspection system has been performed, and a first optical path in an optical device 31A of FIG. 1.

Next, a configuration of the optical device 31A will be described with reference to FIGS. 2 and 3. FIG. 2 is a diagram illustrating a configuration in a state in which switching to the first inspection system is performed, and a first optical path in the optical device 31A, and FIG. 3 is a diagram illustrating a configuration in a state in which switching to the second inspection system is performed, and a second optical path in the optical device 31A.

Figure 3:
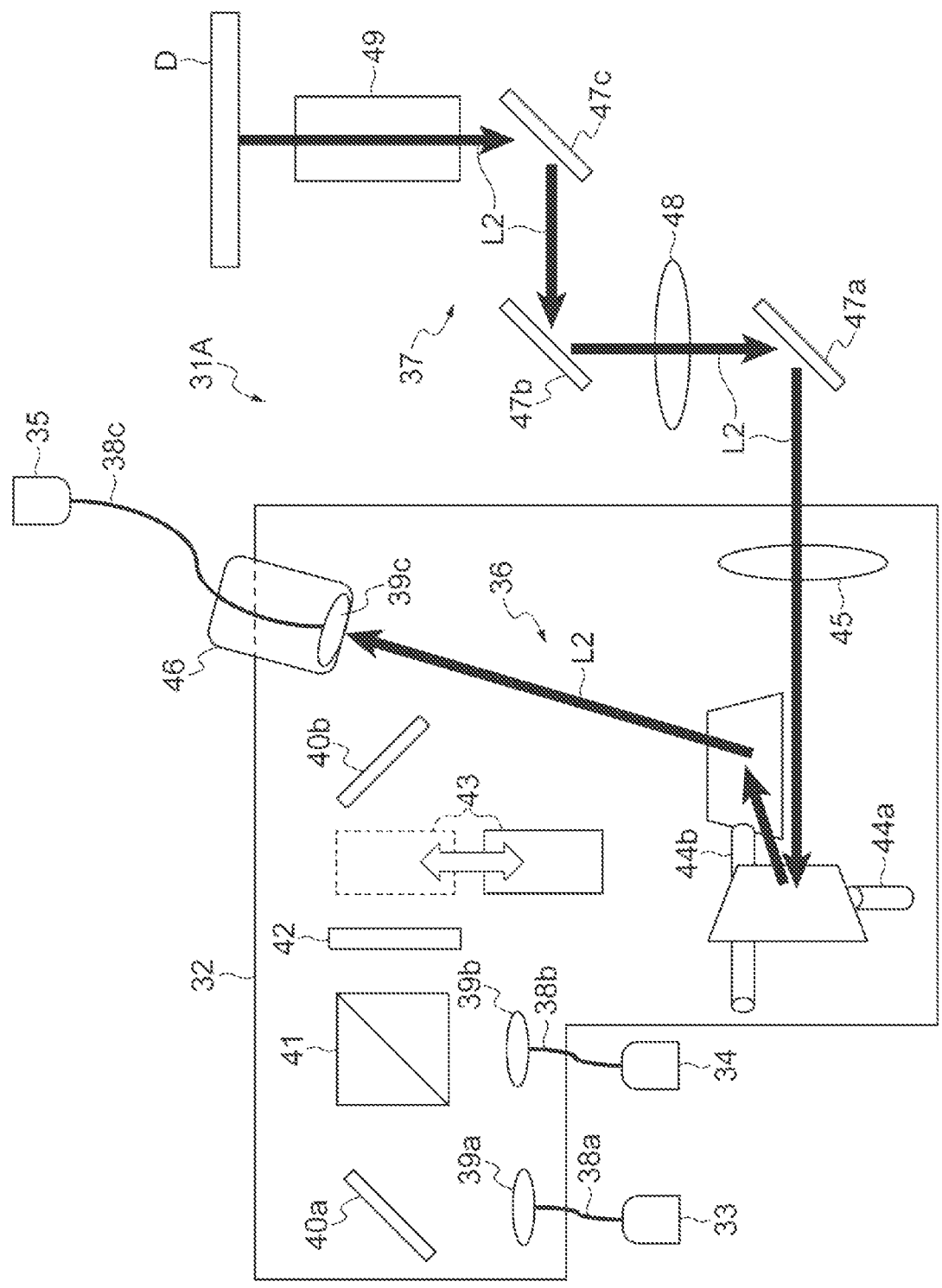
FIG. 3 is a diagram illustrating a configuration in a state in which switching to a second inspection system has been performed, and a second optical path in the optical device 31A of FIG. 1.

As illustrated in FIGS. 2 and 3, the optical device 31A includes a casing 32, a light source (a first light source) 33, a photodetector (a first photodetector) 34, a photodetector (a second photodetector) 35, an internal optical system 36 disposed inside the casing 32, and an external optical system 37 disposed outside the casing 32.

The light source 33 is operated by a power supply (not illustrated) and generates and emits light for irradiating the semiconductor device D with for generating a pattern image of the semiconductor device D. The light source 33 is, for example, an incoherent light source such as a light emitting diode (LED) or a super luminescent diode (SLD) light source. The light source 33 may be, for example, a coherent light source such as a laser. The light output from the light source 33 is radiated to the semiconductor device D via the internal optical system 36 and the external optical system 37.

The photodetector 34 detects the reflected light from the semiconductor device D, and outputs a detection signal of the reflected light of the semiconductor device D to the calculator 21. For example, the photodetector 34 is a light reception element such as a photomultiplier tube, a photodiode (PD), or an avalanche photodiode (APD). The reflected light from the semiconductor device D is incident on the photodetector 34 via the external optical system 37 and the internal optical system 36.

When a stimulation signal such as a test pattern has been applied to the semiconductor device D, the photodetector 35 detects emitted light generated in the semiconductor device D, and outputs a detection signal of the emitted light of the semiconductor device D to the calculator 21. The photodetector 35 is, for example, a superconducting single photon detector (SSPD) that is a superconducting single photon detector, a photomultiplier tube, or a silicon photomultiplier (SiPM). The light from the semiconductor device D is incident on the photodetector 35 via the external optical system 37 and the internal optical system 36.

The internal optical system 36 includes optical fibers 38a, 38b, and 38c, collimator lenses 39a, 39b, and 39c, a mirror 40a, a light guide element (mirror) 40b, a polarization beam splitter (hereinafter referred to as "PBS") 41, a ¼ wavelength plate 42, a variable pupil 43, a pair of Galvano mirrors 44a and 44b, and a pupil relay lens 45.

One ends of the optical fibers 38a, 38b, and 38c are respectively optically connected to the light source 33, the photodetector 34, and the photodetector 35 outside the casing 32, and the other ends of the optical fibers 38a, 38b, and 38c are respectively optically connected to the collimator lenses 39a, 39b, and 39c inside the casing 32. The collimator lens 39a converts the light radiated from the light source 33 into parallel light, and the collimator lenses 39b and 39c convert light incident on the photodetector 34 and the photodetector 35 into parallel light. Thus, by receiving the light from a light scanning unit to be described below using the independent collimator lens for each optical fiber, it is possible to perform optimal adjustment according to a wavelength or a focus of the light from the semiconductor device D.

The mirror 40a is disposed on the light output side of the collimator lens 39a inside the casing 32, the PBS 41 is disposed on the light input side of the collimator lens 39b, and the mirror 40a, the PBS 41, the ¼ wavelength plate 42, the variable pupil 43, and a mirror 40b are arranged side by side in line in that order. The mirror 40a reflects the light output from the light source 33 toward the PBS 41. The PBS 41 transmits linearly polarized light in the light output from the light source 33 toward the mirror 40b, and the ¼ wavelength plate 42 converts the linearly polarized light into circularly polarized light and outputs the circularly polarized light toward the mirror 40b. Further, the ¼ wavelength plate 42 converts reflected light from the semiconductor device D incident from the mirror 40b side into linearly polarized light having a polarization direction orthogonal to that of the linearly polarized light of the light output from the light source 33, and the PBS 41 reflects the linearly polarized light of the reflected light toward the photodetector 34. The variable pupil 43 is provided on an optical path between the mirror 40a and the mirror 40b to be movable into and out of the optical path and is intended to change a size of the pupil.

The mirror 40b is optically connected to the light source 33 and the photodetector 34 as described above. Specifically, the mirror 40b reflects the light output from the light source 33 and guides the light toward the pair of Galvano mirrors 44a and 44b, which are light scanning units. Further, the mirror 40b receives the reflected light from the semiconductor device D via the pair of Galvano mirrors 44a and 44b, and causes the reflected light to be incident on the photodetector 34 via the variable pupil 43, the ¼ wavelength plate 42, the PBS 41, the collimator lens 39b, and the optical fiber 38b. It should be noted that although the mirror is used as the light guide element in the embodiment, an optical fiber or the like may be used as long as the optical fiber or the like is an optical element capable of guiding light between the light source 33 and/or the photodetector 34 and the pair of Galvano mirrors 44a and 44b.

The pair of Galvano mirrors 44a and 44b are configured to be optically connectable to the light source 33 and the photodetector 34 via the mirror 40b, and are optically connected to the external optical system 37 via the pupil relay lens 45. That is, the pair of Galvano mirrors 44a and 44b are light scanning units that are disposed in a reflection direction of the light from the light source 33, of the mirror 40b, and can reflect the light while performing two-dimensional scanning with the light, and have a configuration in which two Galvano mirrors of which a deflection angle can be changed around on a predetermined axis are combined. The pair of Galvano mirrors 44a and 44b can two-dimensionally scan the semiconductor device D with the light to be radiated to the semiconductor device D. Further, the pair of Galvano mirrors 44a and 44b can also guide the reflected light or emitted light at a predetermined point of the semiconductor device D toward a predetermined position of the mirror 40b or the collimator lens 39c while performing two-dimensional position selection. Here, the semiconductor device D may be two-dimensionally illuminated by reflecting a separately prepared light source by one of the mirrors in a state in which the pair of Galvano mirrors 44a and 44b are stopped. The deflection angle of the pair of Galvano mirrors 44a and 44b is configured to be able to be controlled by the control unit 21a of the calculator 21.

The collimator lens 39c is held inside the casing 32 by an attachment portion (a first attachment portion) 46 provided at a position on the casing 32 at which the collimator lens 39c can be optically connected to the pair of Galvano mirrors 44a and 44b. Specifically, this attachment portion 46 forms a cylindrical member, and is a portion for attaching an optical element such as a collimator lens inside the casing 32. The other end of the optical fiber 38c is optically connected to the collimator lens 39c inside the attachment portion 46.

The external optical system 37 includes mirrors 47a, 47b and 47c, a pupil relay lens 48, and an objective lens unit 49. The external optical system 37 guides the light from the light source 33 to be incident on the semiconductor device D, and guides the reflected light and the emitted light generated in the semiconductor device D to be incident on the internal optical system 36. That is, the light from the light source 33 incident from the internal optical system 36 is reflected by the mirror 47a, transmitted through the pupil relay lens 48, sequentially reflected by the mirrors 47b and 47c, and then radiated to the semiconductor device D through the objective lens unit 49. On the other hand, the reflected light or the emitted light in the semiconductor device D passes through the objective lens unit 49, and is sequentially reflected by the mirrors 47c and 47b, transmitted through the pupil relay lens 48, and then reflected by the mirror 47a, such that the light is incident on the internal optical system 36. Here, the objective lens unit 49 may include a plurality of objective lenses with different magnifications and may be configured so that the objective lenses are switched by a turret.

The optical device 31A configured as described above is configured to be able to perform control so that the optical path for optical connection to the semiconductor device D is switched by the calculator 21. That is, the calculator 21 includes the control unit 21a as a functional component.

The control unit 21a of the calculator 21 controls the deflection angle of the pair of Galvano mirrors 44a and 44b so that the optical path optically connected to the semiconductor device D is switched between the first optical path L1 (FIG. 2) including the external optical system 37 and the internal optical system 36 via the pair of Galvano mirrors 44a and 44b and the mirror 40b, and the second optical path L2 (FIG. 3) including the external optical system 37 and the internal optical system 36 via the pair of Galvano mirrors 44a and 44b and the collimator lens 39c in the attachment portion 46 by controlling the deflection angle of the pair of Galvano mirrors 44a and 44b. Specifically, the control unit 21a switches the optical path to the first optical path L1 when the user has instructed execution of the inspection of the reflected light via the input unit 23, and switches the optical path to the second optical path L2 when the user has instructed execution of the inspection of the emitted light via the input unit 23. In addition, the control unit 21a performs control so that the semiconductor device D is two-dimensionally scanned with the light to be radiated to the semiconductor device D by sequentially changing the deflection angle of the pair of Galvano mirrors 44a and 44b within a predetermined angle range, and performs control so that a position of the reflected light or the emitted light is selected at a predetermined point of the semiconductor device D, and the position-selected light is guided, by two-dimensional scanning.

Figure 4:
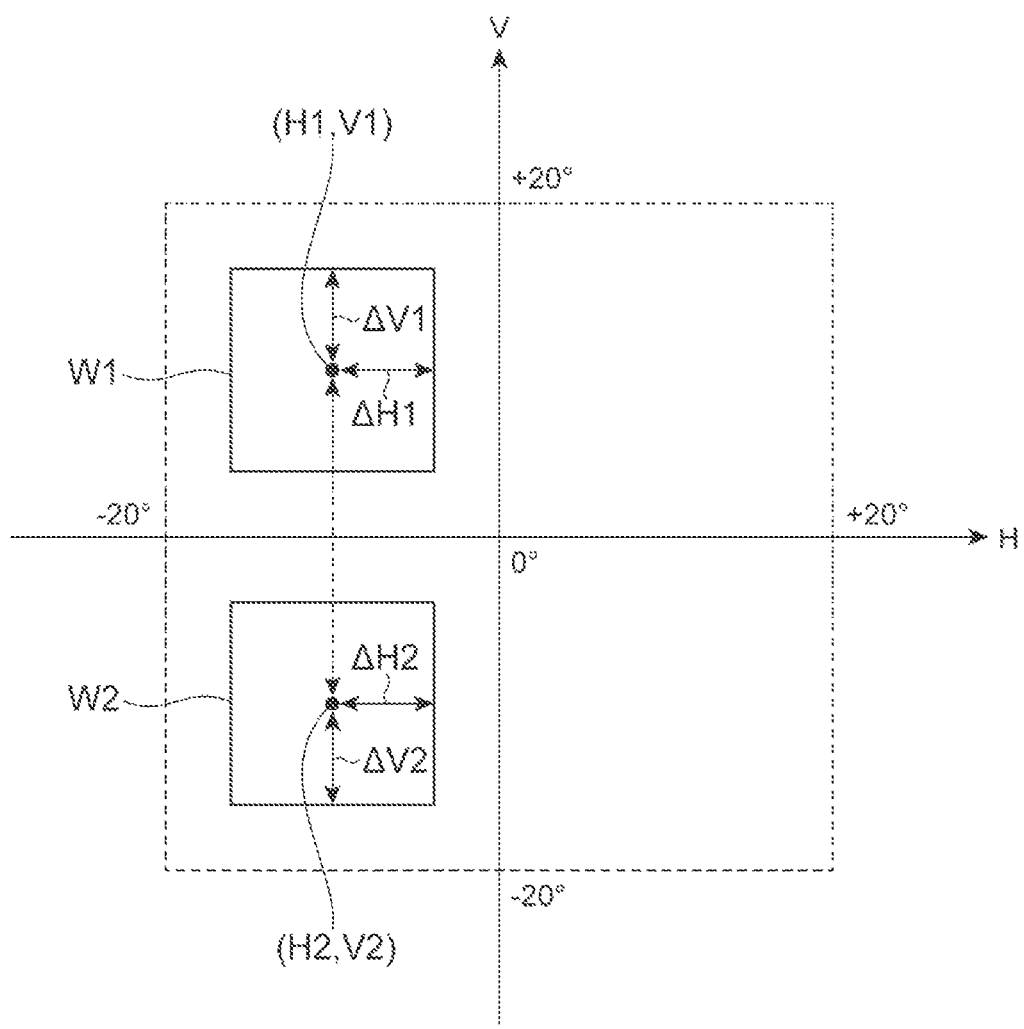
FIG. 4 is a graph illustrating a change range of a deflection angle of a pair of Galvano mirrors 44a and 44b controlled by a control unit 21a of a calculator 21 of FIG. 1.

FIG. 4 illustrates an example of a change range of the deflection angle of the pair of Galvano mirrors 44a and 44b controlled by the control unit 21a of the calculator 21. In a graph of FIG. 4, a horizontal axis H indicates the deflection angle in one direction of the pair of Galvano mirrors 44a and 44b controlled by the control unit 21a, and a vertical axis V indicates the deflection angle in the other direction perpendicular to the one direction of the pair of Galvano mirrors 44a and 44b controlled by the control unit 21a. In the embodiment, the one direction is a horizontal direction, and the other direction is a vertical direction. The control unit 21a performs control to set the deflection angle of the pair of Galvano mirrors 44a and 44b to an offset value (H, V)=(H1, V1) of the deflection angle set in advance when the execution of the reflected light inspection has been instructed, and sequentially change the deflection angle within an angle range W1 of a predetermined angle range (H1±ΔH1, V1±ΔV1) in the one direction and the other direction around the offset value (H1, V1). Further, the control unit 21a performs control to set the deflection angle of the pair of Galvano mirrors 44a and 44b to an offset value (H, V)=(H2, V2) of the deflection angle set in advance when the execution of the emitted light inspection has been instructed, and sequentially change the deflection angle within an angle range W2 of a predetermined angle range (H2±ΔH2, V2±ΔV2) in the one direction and the other direction around the offset value (H2, V2). Here, the control unit 21a performs control so that the range W1 of the deflection angle when switching to the first optical path L1 has been performed and the range W2 of the deflection angle when switching to the second optical path L2 has been performed do not overlap.

The calculator 21 also has a function of generating a pattern image or an emitted light image (an analysis image) on the basis of detection signals input from the photodetectors 34 and 35. That is, the calculator 21 generates a pattern image indicating intensity of the reflected light at each two-dimensional position of the semiconductor device D on the basis of a detection signal obtained while scanning the semiconductor device D with the light from the light source 33 under the control of the control unit 21a. Similarly, the calculator 21 generates an emitted light image indicating intensity of the emitted light at each two-dimensional position of the semiconductor device D on the basis of a detection signal obtained while scanning an observation position on the semiconductor device D under the control of the control unit 21a. Further, the calculator 21 generates, as the analysis image, a superimposed image in which the pattern image and the emitted light image are superimposed, and outputs the generated analysis image to the display unit 22.

With the inspection system 1 described above, the deflection angle of the pair of Galvano mirrors 44a and 44b is controlled so that the optical path optically connected to the semiconductor device D is switched between the first optical path L1 and the second optical path L2. Accordingly, measurement of the reflected light of the semiconductor device D using the light source 33, the photodetector 34, and the mirror 40b, and inspection of the emitted light of the semiconductor device D using the photodetector 35 attached to the attachment portion 46 can be executed in a switching manner. In this case, since the deflection angle of the Galvano mirrors 44a and 44b when switching to the first optical path L1 has been performed and the deflection angle of the Galvano mirrors 44a and 44b when switching to the second optical path L2 has been performed are controlled not to overlap, the optical system of each measurement system can be set to an optimal state independently, and as a result, spatial accuracy of the optical path in each inspection system can be improved, and as a result, the semiconductor device D can be inspected with high accuracy.

Further, in the optical device 31A, the photodetector 35 is attached to the attachment portion 46 such that the emitted light of the semiconductor device D can be detected via the second optical path L2. In this case, when the optical path to be optically connected to the semiconductor device D is switched to the second optical path L2, the emitted light from the semiconductor device can be measured using the photodetector 35. Further, by including the attachment portion 46, it is possible to easily replace the photodetector 35 with another optical element and to perform optimal inspection.

Second Embodiment

Figure 5:
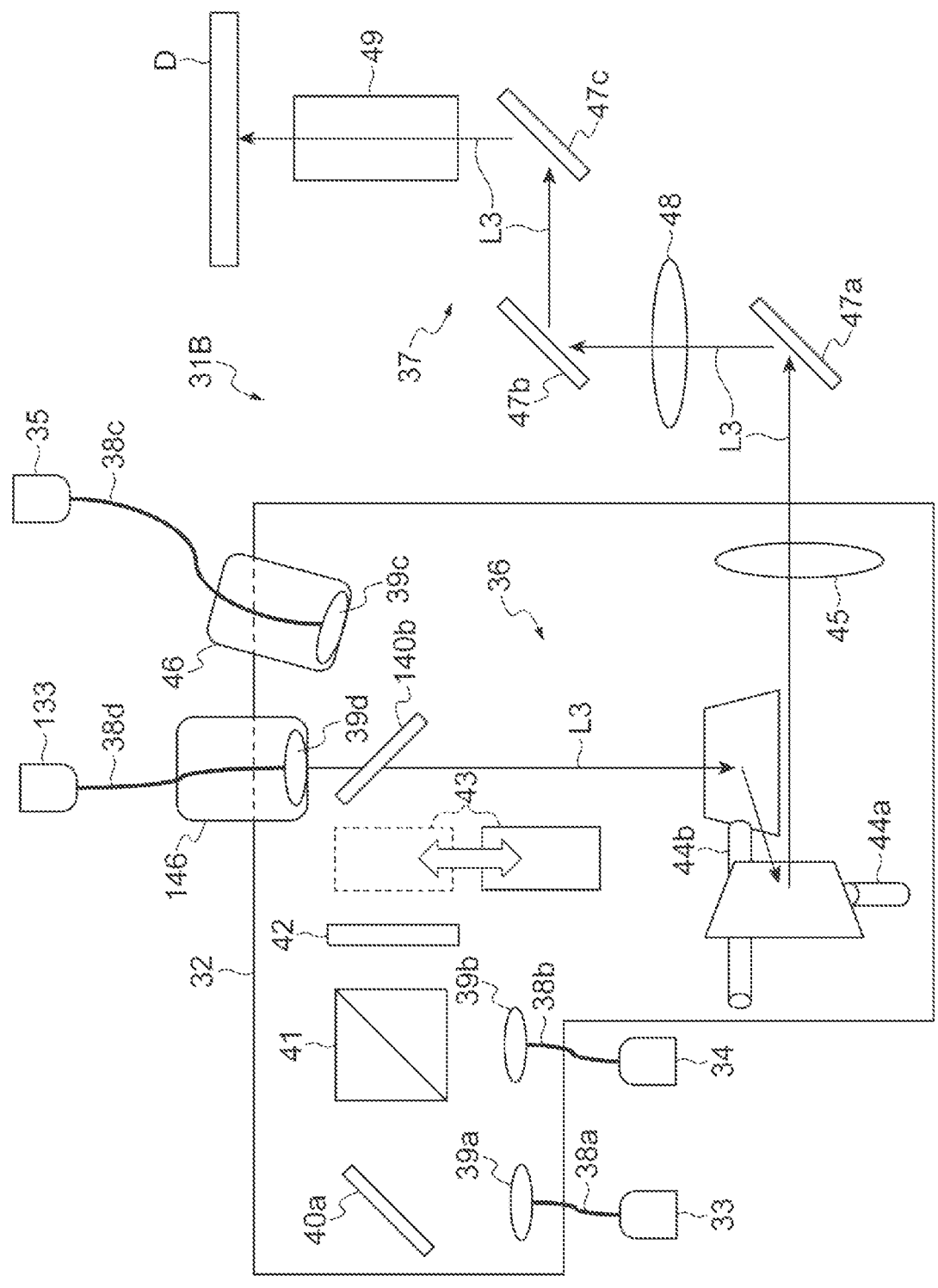
FIG. 5 is a diagram illustrating a configuration of an optical device 31B according to a second embodiment.

FIG. 5 illustrates a configuration of an optical device 31B according to a second embodiment. This optical device 31B is different from that of the first embodiment in that the optical device 31B includes a light source 133, in addition to the light source 33 and the photodetectors 34 and 35.

That is, the optical device 31B further includes the light source (a third light source) 133 that radiates laser light for performing marking indicating a fault location. This light source 133 is optically connected to an internal optical system 36 via a collimator lens 39d and an optical fiber 38d held by an attachment portion (a third attachment portion) 146 provided at a position on a casing 32 at which optical connection to a pair of Galvano mirrors 44a and 44b is possible. Specifically, the attachment portion 146 forms a cylindrical member, and is a portion for attaching an optical element such as a collimator lens inside the casing 32 on an extended line connecting the pair of Galvano mirrors 44a and 44b to a dichroic mirror 140b. Further, the optical device 31B includes the dichroic mirror 140b as a light guide element instead of the mirror 40b, and the light source 133 is optically connected to the dichroic mirror 140b. This dichroic mirror 140b reflects light from the light source 33 toward the pair of Galvano mirrors 44a and 44b, reflects reflected light of the semiconductor device D incident from the pair of Galvano mirrors 44a and 44b toward a photodetector 34, and transmits the laser light from the light source 133 toward the pair of Galvano mirrors 44a and 44b.

In an inspection system 1 including the optical device 31B, when a marking process is executed, the control unit 21a of the calculator 21 controls a deflection angle of the pair of Galvano mirrors 44a and 44b to switch an optical path optically connected to the semiconductor device D to an optical path L3 including an external optical system 37 and the internal optical system 36 via the pair of Galvano mirrors 44a and 44b and the dichroic mirror 140b. Specifically, when a user instructs execution of the marking process via the input unit 23, the control unit 21a switches the optical path to the optical path L3. In this case, a position of the fault location may be specified by the user on the basis of an analysis image displayed on the display unit 22 in advance, and information indicating the fault location is input using the input unit 23. The control unit 21a controls the deflection angle of the pair of Galvano mirrors 44a and 44b so that the deflection angle corresponds to the fault location on the basis of the information indicating the fault location input from the input unit 23. Accordingly, laser marking is performed at a position corresponding to the fault location of the semiconductor device D.

According to the second embodiment described above, the optical system of each measurement system can be set to an optimal state independently, and as a result, spatial accuracy of the optical path in each inspection system can be improved. As a result, the semiconductor device D can be inspected with high accuracy.

It should be noted that as a modification example of the second embodiment, fault analysis of the semiconductor device D may be performed by using, as the light source 133, a laser light source that outputs laser light having a wavelength of 1064 nm, which has energy lower than a band gap of silicon, or laser light having a wavelength of 1300 nm, which has energy higher than the band gap of the silicon. By using such a laser light source, it is possible to perform fault analysis on the basis of a current or voltage output from the semiconductor device D.

Third Embodiment

Figure 6:
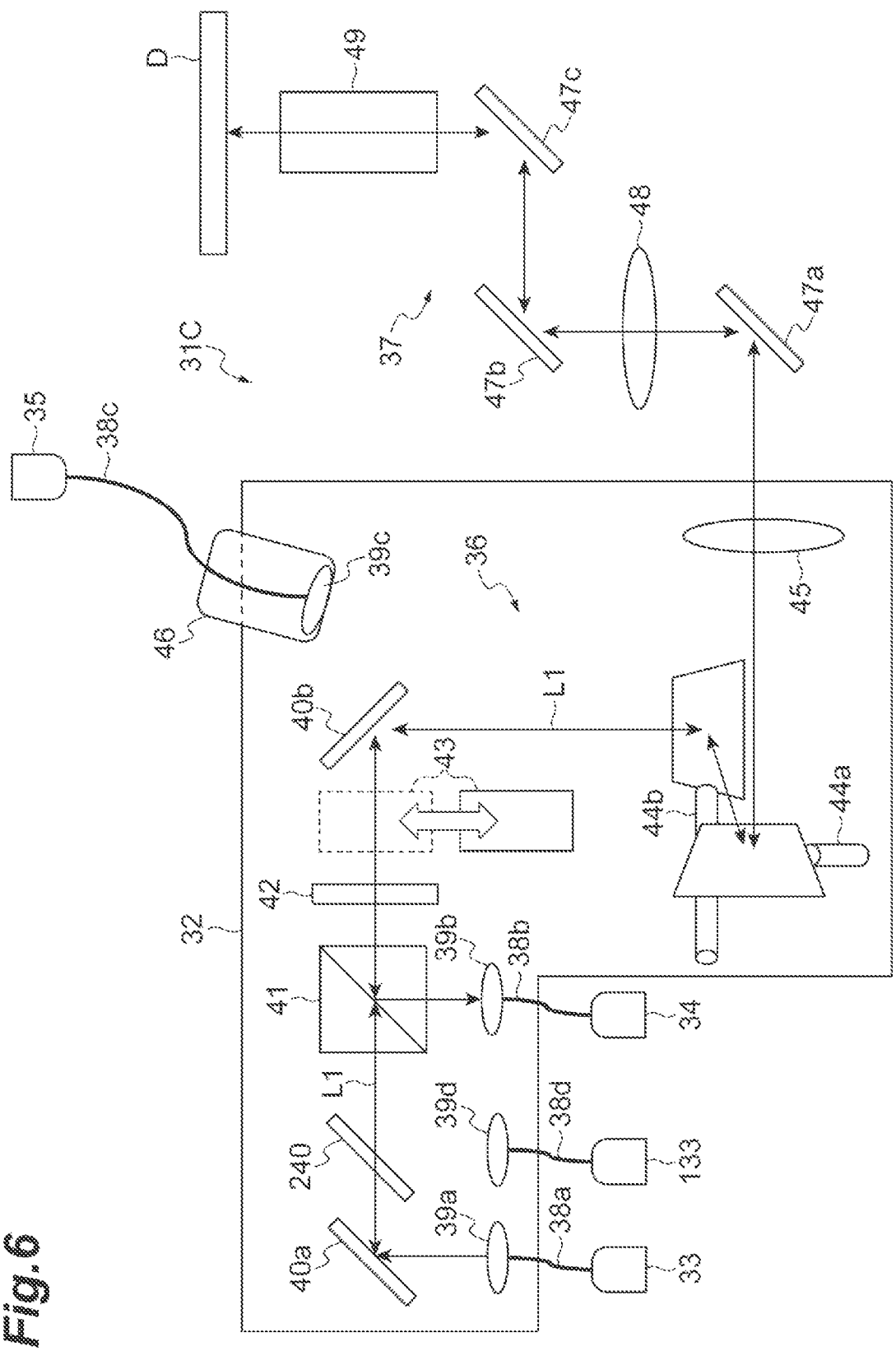
FIG. 6 is a diagram illustrating a configuration of an optical device 31C according to a third embodiment.

FIG. 6 illustrates a configuration of an optical device 31C according to a third embodiment. This optical device 31C is different from that of the second embodiment in that a light source is optically connected to an optical path between two mirrors 40a and 40b.

Specifically, the optical device 31C includes a dichroic mirror 240 disposed between the mirror 40a and a PBS 41 as an internal optical system 36, and a light source 133 is optically connected to the dichroic mirror 240 via the collimator lens 39d and the optical fiber 38d.

In such a configuration, light output from the light source 133 can be radiated to the semiconductor device D via a first optical path L1. A marking process may be performed by using various types of light sources as the light source 133. Further, by combining light sources having different wavelengths from a light source 33 as the light source 133, observation of reflected light or fault analysis may be performed while irradiating the semiconductor device D with light having various wavelengths.

Fourth Embodiment

Figure 7:
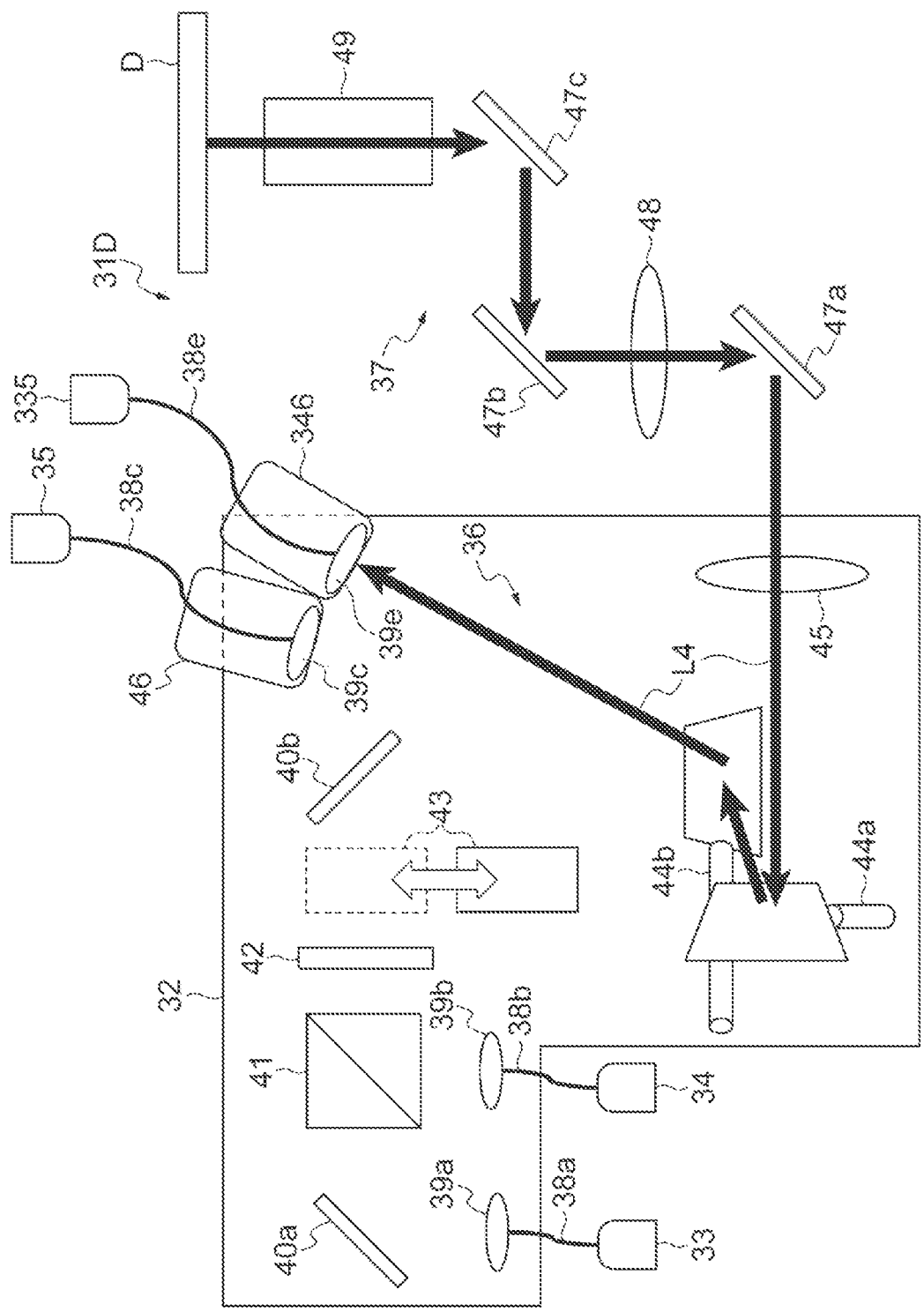
FIG. 7 is a diagram illustrating a configuration of an optical device 31D according to a fourth embodiment.

FIG. 7 illustrates a configuration of an optical device 31D according to a fourth embodiment. This optical device 31D has a configuration in which an optical path that can be optically connected to the semiconductor device D can be switched to a third optical path L4, in addition to a first optical path L1 and a second optical path L2.

Specifically, the optical device 31D further includes a photodetector 335 for inspecting emitted light of the semiconductor device D. This photodetector 335 is optically connected to an internal optical system 36 via a collimator lens 39e and an optical fiber 38e held by an attachment portion (a second attachment portion) 346 provided at a position on a casing 32 at which the photodetector 335 can be optically connected to a pair of Galvano mirrors 44a and 44b. Specifically, the attachment portion 346 forms a cylindrical member, and is a portion for attaching an optical element such as a collimator lens inside the casing 32.

In the inspection system 1 including the optical device 31D, when an emitted light inspection process using the photodetector 335 is executed, the control unit 21a of the calculator 21 controls the deflection angle of the pair of Galvano mirrors 44a and 44b so that the optical path optically connected to the semiconductor device D is switched to the third optical path L4 including the external optical system 37 and the internal optical system 36 via the pair of Galvano mirrors 44a and 44b and the collimator lens 39e in the attachment portion 346. Specifically, when the user has instructed execution of the emitted light inspection process via the input unit 23, the control unit 21a switches the optical path to the optical path L4.

Figure 8:
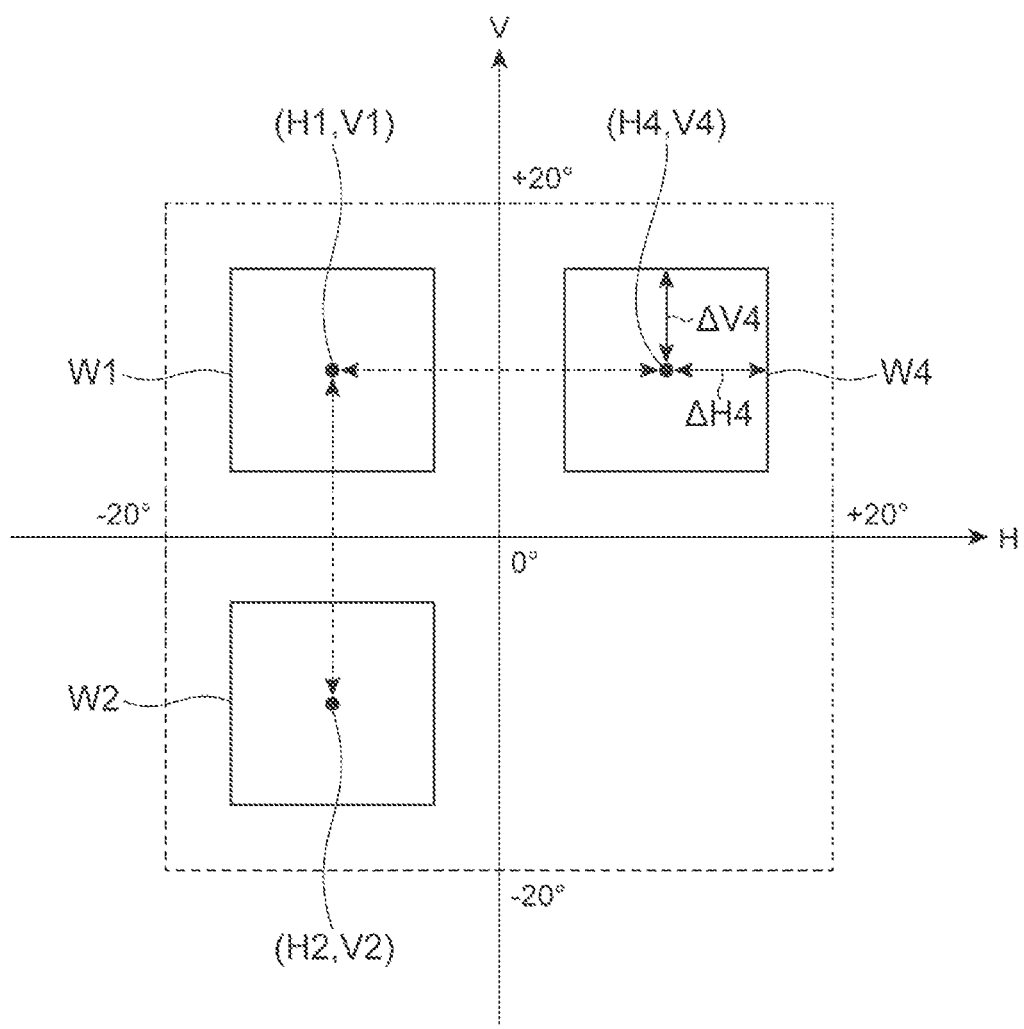
FIG. 8 a graph illustrating a change range of a deflection angle of a pair of Galvano mirrors 44a and 44b controlled by a control unit 21a of a calculator 21 according to the fourth embodiment.

FIG. 8 illustrates an example of a change range of the deflection angle of the pair of Galvano mirrors 44a and 44b controlled by the control unit 21a of the calculator 21. The control unit 21a according to the embodiment performs control to set the deflection angles of the pair of Galvano mirrors 44a and 44b to an offset value (H, V)=(H4, V4) of the deflection angle set in advance when the execution of the emitted light inspection using the photodetector 335 has been instructed, and sequentially change the deflection angle within an angle range W4 of a predetermined angle range (H4±ΔH4, V4±ΔV4) in one direction and the other direction around the offset value (H4, V4). Here, the control unit 21a performs control so that the range W1 of the deflection angle when switching to the first optical path L1 has been performed, the range W2 of the deflection angle when switching to the second optical path L2 has been performed, and the range W4 of the deflection angle when switching to the third optical path L4 has been performed do not overlap.

Figure 9:
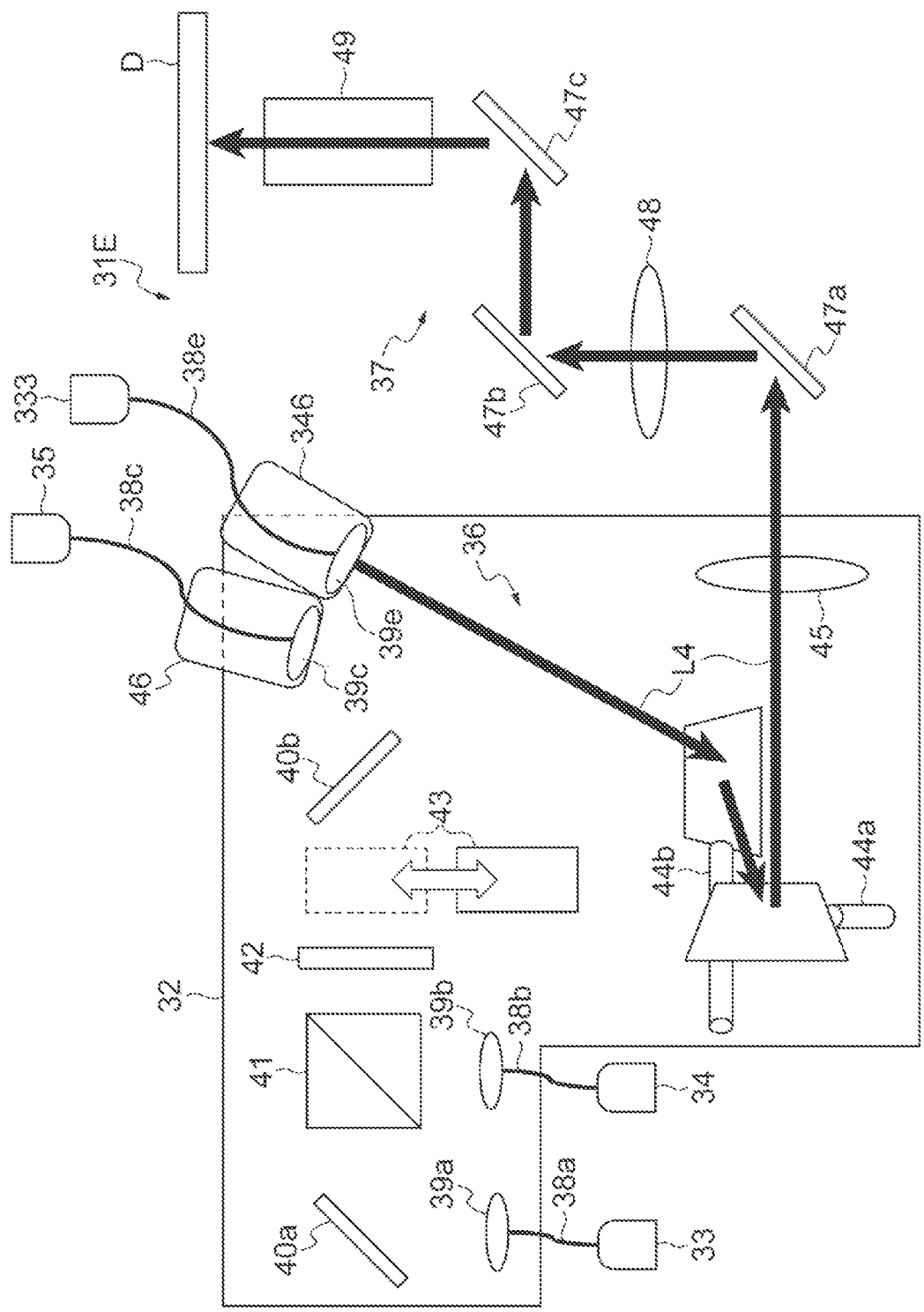
FIG. 9 is a diagram illustrating a configuration of an optical device 31E according to the fourth embodiment.

According to the fourth embodiment as described above, the optical system of each measurement system can be set to an optimal state independently, and as a result, spatial accuracy of the optical path in each inspection system can be improved. As a result, the semiconductor device D can be inspected with high accuracy. It should be noted that in the embodiment, a light source 333 for illumination, marking, heating, or generation of a photovoltaic current of the semiconductor device D may be attached to the attachment portion 346 instead of the photodetector 335, as illustrated in FIG. 9.

It should be noted that the embodiment is not limited to the above-described embodiment.

Figure 10:
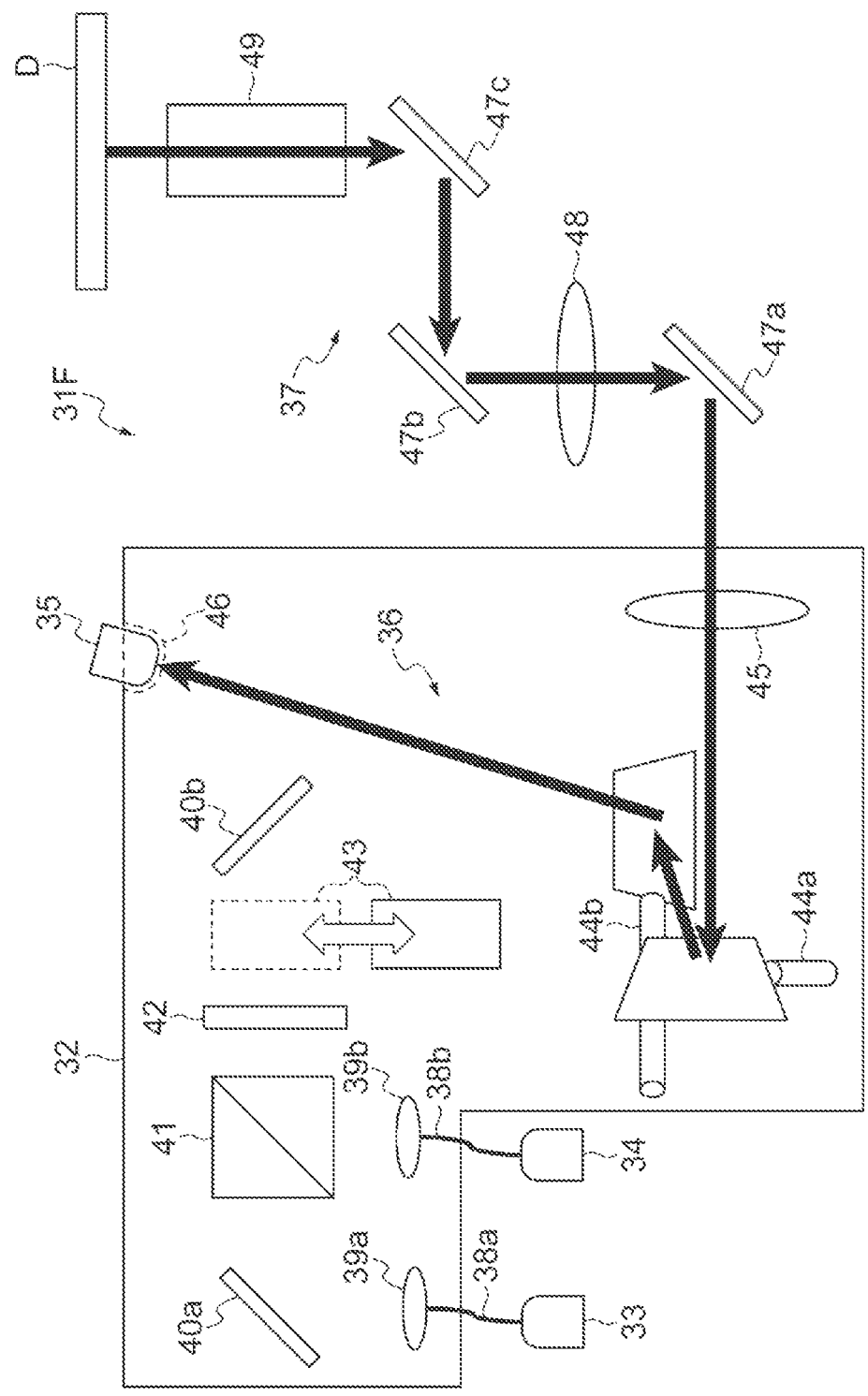
FIG. 10 is a diagram illustrating a configuration of an optical device 31F according to a modification example.

For example, although the photodetector 35 is optically connected to the Galvano mirrors 44a and 44b via the collimator lens and the optical fiber in the first embodiment, the photodetector 35 may be optically directly connected to the Galvano mirrors 44a and 44b, as in an optical device 31F according to a modification example illustrated in FIG. 10.

Figure 11:
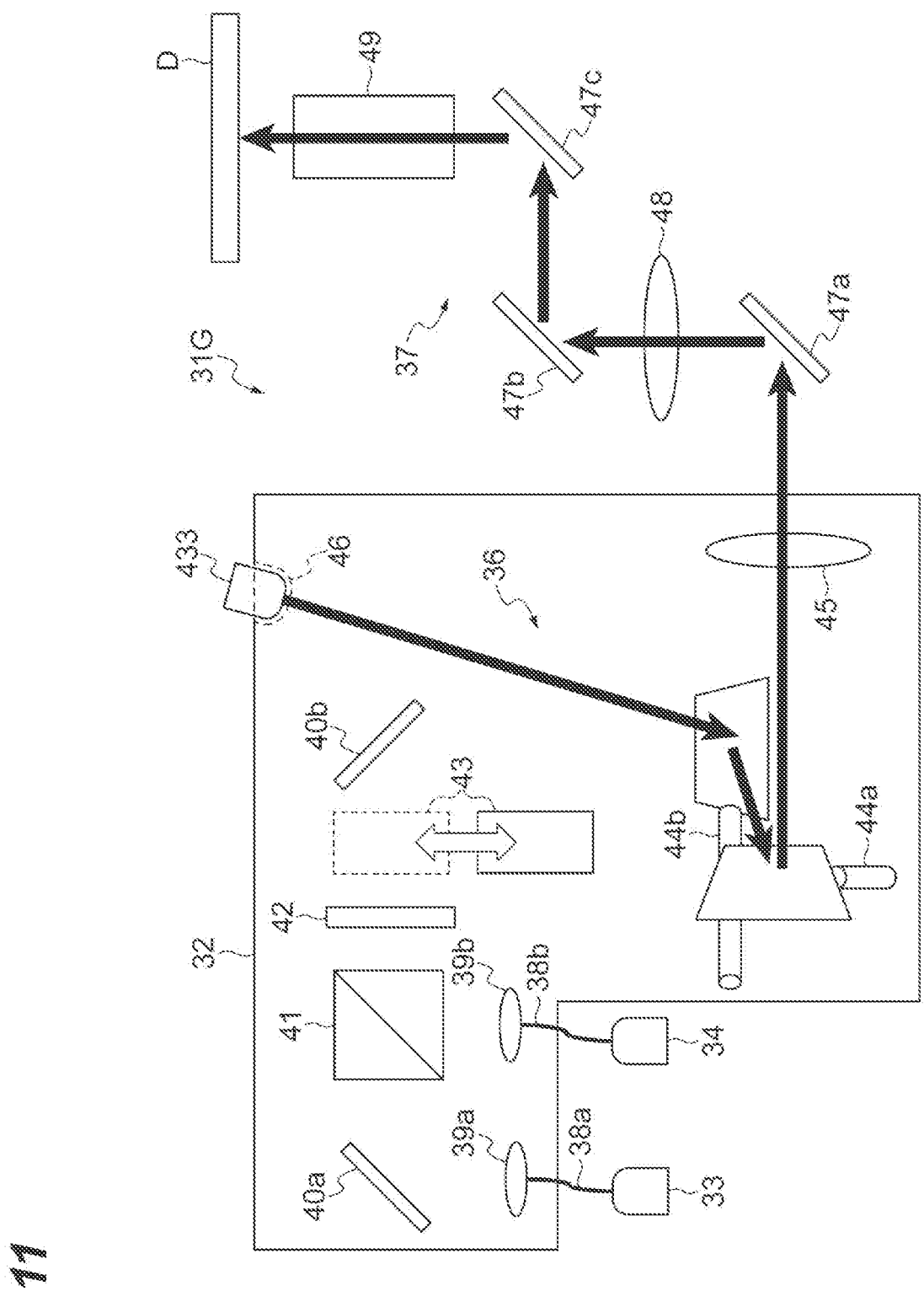
FIG. 11 is a diagram illustrating a configuration of an optical device 31G according to a modification example.

Further, a light source 433 that generates and emits light with which the semiconductor device D is irradiated may be attached to the attachment portion 46 instead of the photodetector 35, as in an optical device 31G according to a modification example illustrated in FIG. 11. In this case, the light source 433 may be optically connected to the Galvano mirrors 44a and 44b via a collimator lens and an optical fiber or may be optically directly connected to the Galvano mirrors 44a and 44b.

Figure 12:
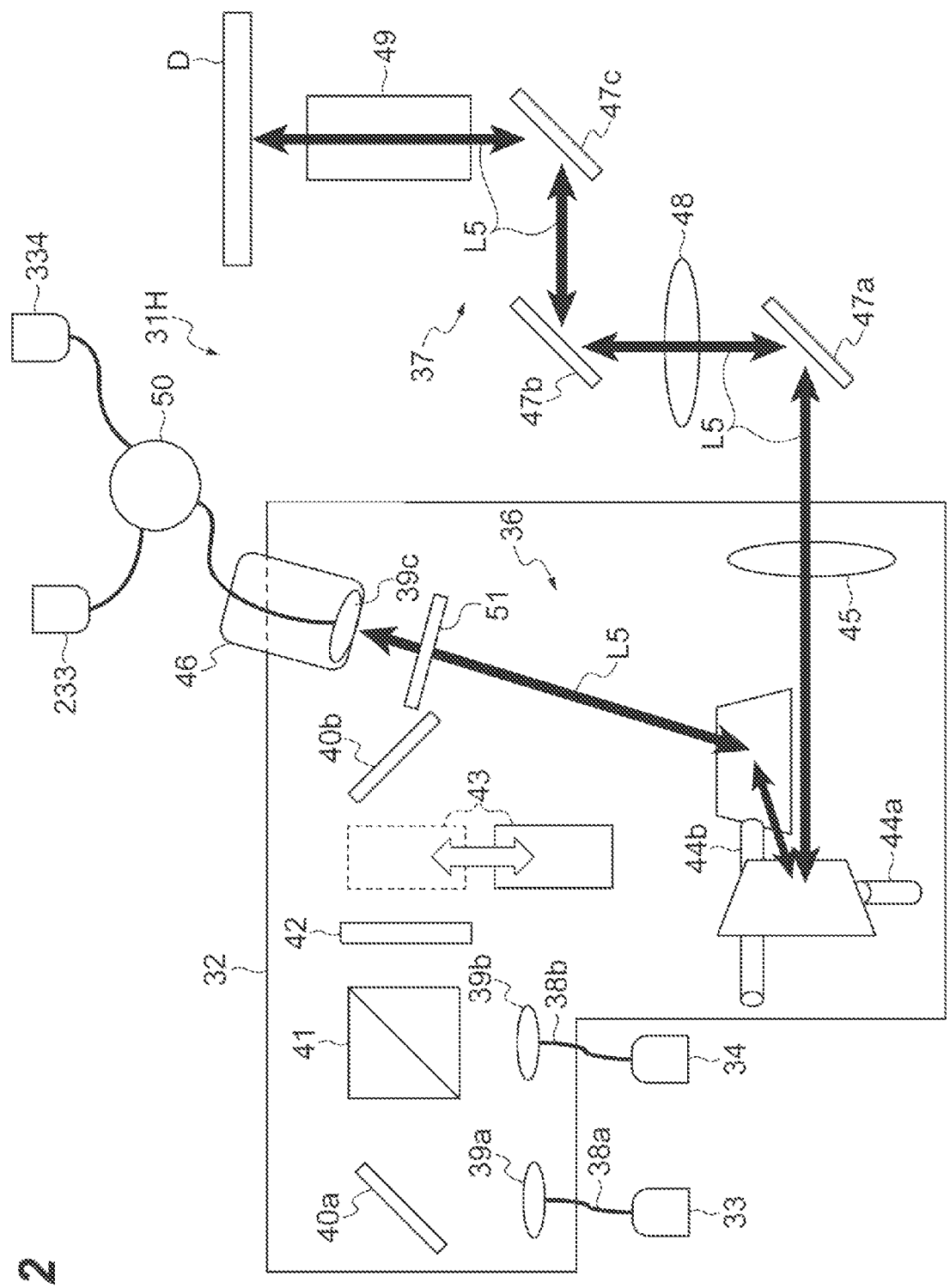
FIG. 12 is a diagram illustrating a configuration of an optical device 31H according to a modification example.

Further, an optical path division element 50 to which a light source 233 and a photodetector 334 have been optically connected may be attached to the attachment portion 46, as in an optical device 31H according to a modification example illustrated in FIG. 12. The light source 233 is, for example, an incoherent light source such as a light emitting diode (LED) or a super luminescent diode (SLD) light source, or a coherent light source such as a laser. The photodetector 334 is, for example, a light reception element such as a photomultiplier tube, a photodiode (PD), or an avalanche photodiode (APD). The optical path division element 50 is, for example, an optical circulator. In this case, when the semiconductor device D is irradiated with the light from the light source 233 via a second optical path L5, light reflected and returning via the second optical path L5 can be guided to the photodetector 334 and detected. In this case, a ½ wavelength plate may be disposed on the optical path L5 as the polarization element 51 and rotated to any angle so that the semiconductor device D is irradiated with light including any linearly polarized light. Further, a polarization maintaining optical fiber coupler may be used as the optical path division element 50, and a ¼ wavelength plate may be disposed on the optical path L5 as the polarization element 51. In this case, the semiconductor device D can be irradiated with the light output from the light source 233 as circularly polarized light, and the light reflected and caused to return by the semiconductor device D can be guided to the photodetector 334 and detected.

Figure 13:
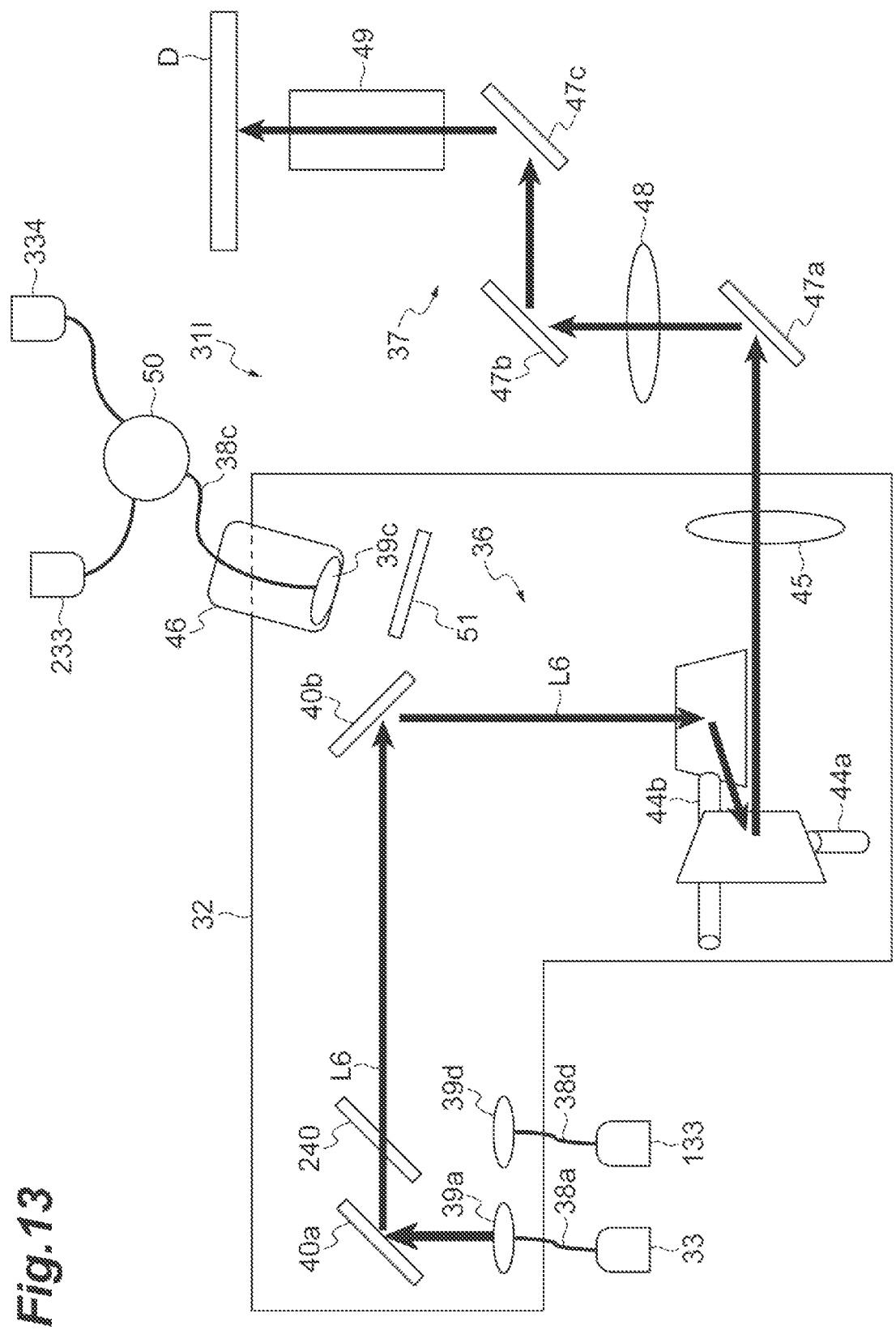
FIG. 13 is a diagram illustrating a configuration of an optical device 31I according to a modification example.

Further, a configuration such as an optical device 31I according to a modification example illustrated in FIG. 13 may be adopted. That is, in the modification example, a configuration in which the photodetector 34 optically connected to the light guide element 40b is not included, a plurality of light sources (the light source 33 and the light source 133) are included as in the third embodiment, and the light source 233 and the photodetector 334 are attached to the attachment portion 46 using the optical path division element 50 to which the light source 233 and the photodetector 334 have been optically connected, unlike the above-described embodiment, may be adopted. In this case, the reflected light of the light radiated from the light source 233 to the semiconductor device D can be detected by the photodetector 334 so that the pattern image is generated, or light having different wavelengths can be generated by the light source 33 and the light source 133 and radiated to the semiconductor device D via the first optical path L6 so that default analysis can be performed.

With the semiconductor inspection device of the above aspect, the deflection angle of the pair of Galvano mirrors is controlled so that the optical path optically connected to the semiconductor device is switched between the first optical path and the second optical path. Accordingly, the measurement of the semiconductor device using the first light source and the light guide element and the inspection of the semiconductor device using the optical element attached to the first attachment portion can be executed in a switching manner. In this case, since the control is performed so that the deflection angle of the Galvano mirror when switching to the first optical path has been performed and the deflection angle of the Galvano mirror when switching to the second optical path has been performed do not overlap, the optical system of each measurement system can be set to an optimal state independently, and as a result, spatial accuracy of the optical path in each inspection system can be improved. As a result, the semiconductor device can be inspected with high accuracy.

The semiconductor inspection device according to the above aspect may further include the first photodetector configured to detect the light from the semiconductor device, and the light guide element may be optically connected to the first photodetector. In this case, switching between measurement of the light of the semiconductor device using the first light source, the first photodetector, and the light guide element, and inspection of the semiconductor device using the optical element attached to the first attachment portion can be performed and the measurement and the inspection can be executed.

Further, the second photodetector configured to detect the light from the semiconductor device may be further included, and the second photodetector may be attached to the first attachment portion such that the light can be detected via the second optical path. In this case, when the optical path optically connected to the semiconductor device is switched to the second optical path, the light from the semiconductor device can be measured using the second photodetector.

Further, the second photodetector may be attached to the first attachment portion via the collimator lens and the optical fiber. In this case, when the optical path optically connected to the semiconductor device is switched to the second optical path, the light from the semiconductor device can be measured by the second photodetector via the collimator lens and the optical fiber.

Further, a second light source configured to emit light for irradiating the semiconductor device with may be further included, and the second light source may be attached to the first attachment portion, such that the semiconductor device is irradiated with the light via the second optical path. In this case, when the optical path optically connected to the semiconductor device is switched to the second optical path, the semiconductor device can be irradiated with light using the second light source and the semiconductor device can be inspected.

Further, the second light source may be attached to the first attachment portion via the collimator lens and the optical fiber. In this case, when the optical path optically connected to the semiconductor device is switched to the second optical path, the semiconductor device can be irradiated with light using the second light source via the collimator lens and the optical fiber and can be inspected.

Further, a second light source configured to emit light for irradiating the semiconductor device with, a second photodetector configured to detect light from the semiconductor device, and an optical path division element optically connected to the second light source and the second photodetector may be further included, and the optical path division element may be attached to the first attachment portion, such that the light can be radiated and/or detected via the second optical path. In this case, when the optical path optically connected to the semiconductor device is switched to the second optical path, it is possible to measure the light from the semiconductor device while irradiating the semiconductor device with the light using the second light source.

Further, the casing may further include a second attachment portion for attaching an optical element, the second attachment portion being provided at a position at which the optical element can be optically connected to the pair of Galvano mirrors, and the control unit may control the deflection angle so that switching among the first optical path, the second optical path, and the third optical path passing through the pair of Galvano mirrors and the second attachment portion is performed, and may control the deflection angle so that the deflection angle when switching to the first optical path has been performed, the deflection angle when switching to the second optical path has been performed, and the deflection angle when switching to the third optical path has been performed do not overlap. In this case, by switching the optical path optically connected to the semiconductor device to the third optical path, it is possible to execute the inspection of the semiconductor device using the optical element attached to the second attachment portion in a switching manner. In this case, since the control is performed so that the deflection angle of the Galvano mirror when switching to the first optical path has been performed, the deflection angle of the Galvano mirror when switching to the second optical path has been performed, and the deflection angle of the Galvano mirror when switching to the third optical path has been performed do not overlap, the optical system of each inspection system can be set to an optimal state independently, and as a result, spatial accuracy of the optical path in each inspection system can be improved. As a result, it is possible to inspect the semiconductor device with high accuracy.

Further, the light guide element may be a mirror. Further, the mirror as the light guide element may be a dichroic mirror, and the casing may further include the third attachment portion for attaching the optical element on an extended line connecting the pair of Galvano mirrors to the dichroic mirror. In this case, when the optical path optically connected to the semiconductor device is switched to the first optical path, inspection of the semiconductor device using the optical element attached to the third attachment portion can be performed.

Further, a third light source optically connected to the light guide element may be further included. Thus, when the optical path optically connected to the semiconductor device is switched to the first optical path, it is possible to perform the measurement of the light of the semiconductor device while irradiating the semiconductor device with light using the third light source.

Further, the second photodetector may be a superconducting single photon detector.

INDUSTRIAL APPLICABILITY

In the embodiment, the semiconductor inspection device is used as an application, it is possible to inspect a semiconductor device with high accuracy by improving spatial accuracy of optical paths in a plurality of optical elements.

REFERENCE SIGNS LIST

1 Inspection system (semiconductor inspection device)
21 Calculator
21a Control unit
31A to 31G Optical device
32 Casing
33 (First) light source
34 (First) photodetector
35 (Second) photodetector
38a to 38e Optical fiber
39a to 39e Collimator lens
40b Light guide element (mirror)
44a, 44b Pair of Galvano mirrors
46 (First) attachment portion
50 Optical path division element
133 (Third) light source
140b Dichroic mirror
146 (Third) attachment portion
240 Dichroic mirror
333 (Second) light source
346 (Second) attachment portion
D Semiconductor device
L1 (First) optical path
L2 (Second) optical path
L4 (Third) optical path

The invention claimed is:

1. A semiconductor inspection device that inspects a semiconductor device, the semiconductor inspection device comprising:
a first light source configured to emit light for irradiating the semiconductor device with;
a mirror optically connected to the first light source;
a pair of Galvano mirrors provided at positions at which the Galvano mirrors are optically connectable to the first light source via the mirror;
a first photodetector optically connected to the mirror and configured to detect a light form the semiconductor device;
a polarization beam splitter configured to transmit the light emitted from the first light source and configured to reflect the light from the semiconductor device through the pair of Galvano mirrors toward the first photodetector;
a first attachment portion for attaching an optical element, the first attachment portion being provided at a position at which the optical element is optically connectable to the pair of Galvano mirrors; and
a controller configured to control a deflection angle of the pair of Galvano mirrors,
wherein the controller
controls the deflection angle so that an optical path optically connected to the semiconductor device is switched between a first optical path passing through the pair of Galvano mirrors and the mirror and a second optical path passing through the pair of Galvano mirrors and the first attachment portion, and
controls the deflection angle so that the deflection angle when switching to the first optical path has been performed and the deflection angle when switching to the second optical path has been performed do not overlap.

2. The semiconductor inspection device according to claim 1, further comprising:
a second light source configured to emit light for irradiating the semiconductor device with,
wherein the second light source is attached to the first attachment portion, such that the light can be radiated via the second optical path.

3. The semiconductor inspection device according to claim 2, wherein the second light source is attached to the first attachment portion via a collimator lens and an optical fiber.

4. The semiconductor inspection device according to claim 2, wherein the second light source is a light source configured to irradiate with a laser light for marking indicating a fault location.

5. The semiconductor inspection device according to claim 2, wherein the second light source is a laser light source configured to output a laser light having a wavelength of 1300 nm.

6. The semiconductor inspection device according to claim 1, further comprising:
a second photodetector configured to detect light from the semiconductor device,
wherein the second photodetector is configured to detect the light via the second optical path by being attached to the first attachment portion.

7. The semiconductor inspection device according to claim 6, wherein the second photodetector is attached to the first attachment portion via a collimator lens and an optical fiber.

8. The semiconductor inspection device according to claim 6, wherein the second photodetector is a superconducting single photon detector.

9. The semiconductor inspection device according to claim 1, further comprising:
a second attachment portion for attaching an optical element, the second attachment portion being provided at a position at which the optical element can be optically connected to the pair of Galvano mirrors,
wherein the controller
controls the deflection angle so that switching among the first optical path, the second optical path, and a third optical path passing through the pair of Galvano mirrors and the second attachment portion is performed, and controls the deflection angle so that the deflection angle when switching to the first optical path has been performed, the deflection angle when switching to the second optical path has been performed, and the deflection angle when switching to the third optical path has been performed do not overlap.

10. The semiconductor inspection device according to claim 1, further comprising:
a third light source optically connected to the mirror.

11. The semiconductor inspection device according to claim 1,
wherein the mirror is a dichroic mirror, and
wherein the semiconductor inspection device further includes a third attachment portion for attaching an optical element on an extended line connecting the pair of Galvano mirrors to the dichroic mirror.

12. The semiconductor inspection device according to claim 1, further comprising:
a first photodetector is a photodiode or an avalanche photodiode.

* * * * *